United States Patent
Ryu et al.

(10) Patent No.: US 7,915,610 B2
(45) Date of Patent: **\*Mar. 29, 2011**

(54) ZNO-BASED THIN FILM TRANSISTOR AND METHOD OF MANUFACTURING THE SAME

(75) Inventors: Myung-kwan Ryu, Yongin-si (KR); Jun-seong Kim, Hwaseong-si (KR); Sang-yoon Lee, Seoul (KR); Euk-che Hwang, Osan-si (KR); Tae-sang Kim, Seoul (KR); Jang-yeon Kwon, Seongnam-si (KR); Kyung-bae Park, Seoul (KR); Kyung-seok Son, Seoul (KR); Ji-sim Jung, Incheon (KR)

(73) Assignee: Samsung Electronics Co., Ltd. (KR)

( \* ) Notice: Subject to any disclaimer, the term of this patent is extended or adjusted under 35 U.S.C. 154(b) by 0 days.

This patent is subject to a terminal disclaimer.

(21) Appl. No.: 12/615,315

(22) Filed: Nov. 10, 2009

(65) Prior Publication Data

US 2010/0051942 A1    Mar. 4, 2010

Related U.S. Application Data

(62) Division of application No. 11/960,567, filed on Dec. 19, 2007, now Pat. No. 7,638,360.

(30) Foreign Application Priority Data

May 17, 2007    (KR) .................. 10-2007-0048310

(51) Int. Cl.
*H01L 29/10*    (2006.01)

(52) U.S. Cl. ........... 257/43; 257/E27.014; 257/E31.003; 257/E31.037

(58) Field of Classification Search .................... 257/43, 257/E27.014, E31.003, E31.037, E31.034; 438/104

See application file for complete search history.

(56) References Cited

U.S. PATENT DOCUMENTS

| 7,638,360 B2 * | 12/2009 | Ryu et al. ...................... 438/104 |
| 2005/0017302 A1 | 1/2005 | Hoffman |

(Continued)

FOREIGN PATENT DOCUMENTS

EP    1 209 748 A1    5/2002

(Continued)

OTHER PUBLICATIONS

B. Hahn, et al "MOCVD layer growth of AnO using DMZn and tertiary butanol" Semicond. Sci. Technol. vol. 13, (1998), pp. 788-791.*

(Continued)

*Primary Examiner* — Caridad M Everhart
(74) *Attorney, Agent, or Firm* — Cantor Colburn LLP

(57) ABSTRACT

A ZnO-based thin film transistor (TFT) is provided herein, as is a method of manufacturing the TFT. The ZnO-based TFT has a channel layer that comprises ZnO and ZnCl, wherein the ZnCl has a higher bonding energy than ZnO with respect to plasma. The ZnCl is formed through the entire channel layer, and specifically is formed in a region near the surface of the channel layer. Since the ZnCl is strong enough not to be decomposed when exposed to plasma etching gas, an increase in the carrier concentration can be prevented. The distribution of ZnCl in the channel layer, may result from the inclusion of chlorine (Cl) in the plasma gas during the patterning of the channel layer.

6 Claims, 8 Drawing Sheets

U.S. PATENT DOCUMENTS

| | | |
|---|---|---|
| 2006/0244107 A1 | 11/2006 | Sugihara et al. |
| 2007/0048970 A1 | 3/2007 | Suzuki et al. |
| 2007/0072439 A1 | 3/2007 | Akimoto et al. |
| 2007/0184571 A1 | 8/2007 | Yang |
| 2008/0254569 A1 | 10/2008 | Hoffman et al. |

FOREIGN PATENT DOCUMENTS

| | | | |
|---|---|---|---|
| JP | | 01265568 A | 10/1989 |

OTHER PUBLICATIONS

E. Chikoidze, et al "Effect of chlorine doping on electrical and optical properties of ZnO thin films". Thin Solid Films, vol. 516, pp. 8146-8149 (2008).*

European Search Report for Application No. 08150763.4-1528 dated Aug. 14, 2008.

* cited by examiner

ZNO-BASED THIN FILM TRANSISTOR AND METHOD OF MANUFACTURING THE SAME

CROSS-REFERENCE TO RELATED PATENT APPLICATION

This application is a divisional of U.S. application Ser. No. 11/960,567, filed on Dec. 19, 2007, which claims priority to Korean Patent Application No. 10-2007-0048310, filed on May 17, 2007, and all the benefits accruing therefrom under 35 U.S.C. 119, the content of which is herein incorporated by reference in its entirety.

BACKGROUND OF THE INVENTION

1. Field of the Invention

The disclosure relates to a ZnO-based thin film transistor (TFT) and a method of manufacturing the same.

2. Description of the Related Art

Televisions ("TV"s) are the main applications for the rapidly progressing field of flat panel displays. While liquid crystal displays ("LCD"s) are the most widely used displays for TVs, many attempts have been made to use organic light-emitting diodes ("OELD"s) for TVs. The development of displays for TVs has moved toward a focus on the incorporation of large screens, digital information displays ("DID"), low cost, as well as a high level of quality in the moving image, resolution, brightness, contrast, and color production, each of which are important considerations in the market. To this end, the substrate should be increased in size, and a high quality thin film transistor ("TFT") should be used as a display switching and driving element without increasing the overall cost. Given this trend, an effort is needed to develop TFTs for high quality displays that can be manufactured at a low cost.

Amorphous-silicon ("a-Si") TFTs, which can be uniformly formed at a low cost on a large substrate up to 2 meters (m) wide or larger, are now widely used as driving and switching elements for displays. However, as the displays become larger the driving and switching devices are also desired to have higher performance in order to ensure a high quality image, and as such, the application of existing a-Si TFTs is limited due to their having a low electron mobility of approximately 0.5 centimeters squared per Volt second ($cm^2/Vs$). Accordingly, high performance TFTs having an electron mobility that is higher than the electron mobility of the a-Si TFTs, need to be developed. In addition, the a-Si TFTs have another problem in that the performance of the a-Si TFTs degrades as they are operated over a long period of time, thereby lowering their reliability. For this reason, the application of a-Si TFTs to OLEDs, particularly as compared to LCDs, is difficult since OLEDs emit light using a continuously applied current.

Since poly-silicon ("poly-Si") TFTs have a much higher performance than that of a-Si TFTs (i.e. a high mobility of tens to hundreds of $cm^2/Vs$), the poly-Si TFTs can be applied to high quality displays for which existing a-Si TFTs are unsuitable. In addition, the degradation of poly-Si TFTs is much less than that of a-Si TFTs. However, in order to manufacture poly-Si TFTs, more processes are involved than those needed to manufacture a-Si TFTs and, additional equipment is also required. Accordingly, since poly-Si TFTs are economically inferior to a-Si TFTs, the poly-Si TFTs suffer from limitations as well. Since poly-Si TFTs have not been manufactured on a large substrate exceeding 1 m in width or size yet because of technical problems, for example, insufficient equipment or poor uniformity, the application of poly-Si TFTs to TVs is problematic, thereby making it more difficult for high performance poly-Si TFTs to survive and prosper in the market.

Accordingly, the demand for TFTs having a large design, low cost, and high uniformity, which are the advantages of a-Si TFTs, and high performance and high reliability, which are the advantages of a poly-Si TFTS, is the highest ever and research into the development of TFTs incorporating all of these elements is ongoing. One focus of research is on the development of an oxide semiconductor. Recently, ZnO-based TFTs have received increasing attention as oxide semiconductor devices. Different types of ZnO-based TFTs include a zinc oxide (ZnO) TFT, and a gallium-indium-zinc-oxide ("GIZO") TFT that is a mixture of gallium oxide ($Ga_2O_3$), indium oxide ($In_2O_3$), and ZnO. According to Korean Patent Laid-Open No. 2004-0106576 and Korean Patent Laid-Open No. 2006-0123765, a ZnOx TFT, which is polycrystalline, has a high electron mobility similar to that of a poly-Si TFT but has low uniformity, while a GIZO TFT, which is amorphous, has higher characteristics than those of a-Si TFT. Accordingly, the GIZO TFT offers both the advantages of the a-Si TFT and the poly-Si TFT because the GIZO TFT is manufactured in the same manner as the a-Si TFT, thereby standing out as the optimal device. However, a well-defined method for manufacturing a GIZO TFT has not been developed, as there are several technical problems in the manufacturing processes. The production of bottom gate back channel etching ("BCE") TFTs is preferred for several known reasons.

Since a GIZO semiconductor film is amorphous, the GIZO semiconductor film can be processed at a low temperature and can be easily made on a large scale. This aspect of the GIZO TFT is advantageous as the physical and electrical properties of the ZnO-based semiconductor film are greatly affected by thermal and chemical shock. When a ZnO-based TFT is manufactured, the ZnO-based semiconductor film is exposed to high-energy plasma.

Further, the carrier concentration in ZnO-based semiconductor films, including the GIZO semiconductor film, is sensitive to a change in oxygen concentration. Presently, the semiconductor film experiences an oxygen vacancy due to the decomposition of ZnO, resulting in an increase in the carrier concentration. The undesirable increase in the carrier concentration shifts the threshold voltage of the ZnO-based TFT to a more negative value, such that a large leakage current flows between the source electrode and the drain electrode even when a gate voltage is 0 Volts (V). The defect of a channel layer shifting the threshold voltage is related to the increase in the carrier concentration in the channel layer. Accordingly, there is a demand for a method of manufacturing a ZnO-based TFT having the desired electrical properties, by controlling the carrier concentration.

SUMMARY OF THE INVENTION

The present disclosure provides a ZnO-based thin film transistor (TFT) which can effectively prevent the damage that occurs in a channel layer as the result of exposure to plasma or the like. A method for manufacturing the ZnO-based TFT is also provided.

According to one aspect, a TFT is provided comprising: a substrate; a channel layer comprising ZnO disposed on the substrate; a gate disposed between the substrate and the channel layer; a gate insulating layer disposed between the channel layer and the gate; a source electrode and a drain electrode disposed on both sides of the channel layer; and a passivation layer covering the channel layer, the source electrode, and the drain electrode, wherein the channel layer further comprises a chloride.

According to another aspect, the chloride may be distributed in a region near a surface of the channel layer.

In one embodiment, the channel layer may be a layer comprising $a(In_2O_3) \cdot b(Ga_2O_3) \cdot c(ZnO)$ where $a \geq 0$, $b \geq 0$, and $c > 0$.

In another embodiment, the channel layer may be a layer comprising $a(In_2O_3) \cdot b(Ga_2O_3) \cdot c(ZnO)$ where $a \geq 1$, $b \geq 1$, and $0 < c \leq 1$.

The chloride may contain at least one selected from the group consisting of $GaCl_3$, $InCl_3$, and $ZnCl_2$ or $GaCl_x$, $InCl_x$, and $ZnCl_y$ where $0 < x \leq 3$ and $0 < y \leq 2$.

According to one embodiment, a method of manufacturing a TFT is provided, the method comprising: forming a gate on a substrate and forming a gate insulating layer covering the gate; forming a channel layer on the gate insulating layer in a position corresponding to the gate; forming a conductive material layer on the channel layer, and patterning the conductive material layer to form a source electrode and a drain electrode disposed on both sides of the channel layer; forming a passivation layer on the channel layer, the source electrode, and the drain electrode; and annealing the channel layer, wherein the patterning of the conductive material layer comprises dry etching using a chlorine (Cl) etching gas or a chlorine-based etching gas, wherein a bond is formed between a Cl of the etching gas and a material of the channel layer to form a chloride in a region near the surface of the channel layer exposed to the etching gas forming a gate insulating layer disposed on the gate.

According to another embodiment, a method of manufacturing a TFT is provided, the method comprising: forming a gate on a substrate and forming a gate insulating layer covering the gate; forming a channel layer comprising ZnO on the gate insulating layer in a position corresponding to the gate; forming a conductive material layer on the channel layer; patterning the conductive material layer to form a source electrode and a drain electrode disposed on both sides of the channel layer; forming a passivation layer on the channel layer, the source electrode, and the drain electrode; and annealing the channel layer, wherein the channel layer further comprises a chloride.

In one embodiment, the channel layer may be formed by physical vapor deposition (PVD) methods comprising sputtering and evaporation.

In another embodiment, the gate insulating layer may be formed of silicon nitride (SiNx).

In yet another embodiment, the channel layer may be formed of gallium-indium-zinc-oxide (GIZO), and the gate insulating layer may be formed of SiNx.

BRIEF DESCRIPTION OF THE DRAWINGS

The above and other features and advantages of the present invention will become more apparent by describing in detail exemplary embodiments thereof with reference to the attached drawings in which.

Figure 1:
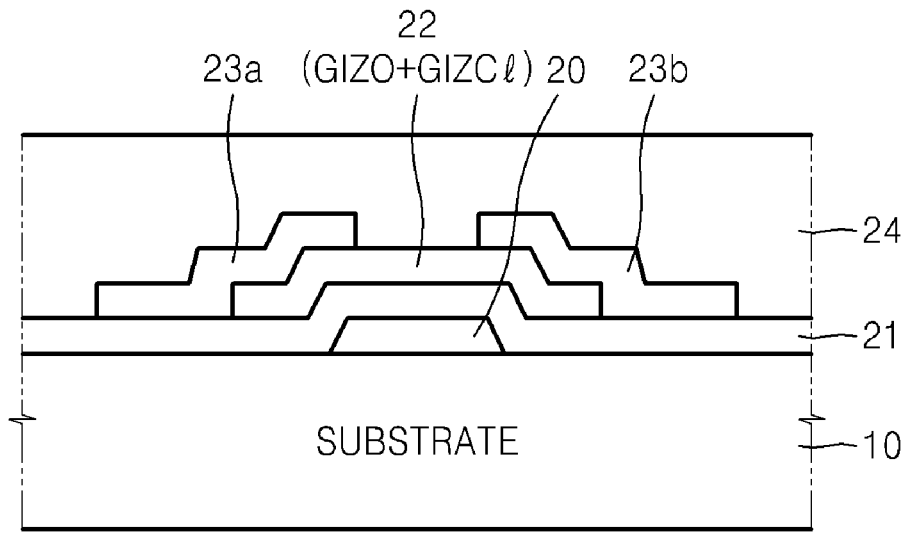
FIG. 1 is an exemplary cross-sectional view of a ZnO-based thin film transistor (TFT) of the present invention.

With regard to the above drawings, the widths and thicknesses of layers or regions shown in the drawings are exaggerated for clarity.

DETAILED DESCRIPTION OF THE INVENTION

The present invention will now be described more fully with reference to the to accompanying drawings, in which exemplary embodiments of the invention are shown.

It will be understood that when an element or layer is referred to as being "on," "interposed," "disposed," or "between" another element or layer, it can be directly on, interposed, disposed, or between the other element or layer or intervening elements or layers may be present.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, first element, component, region, layer or section discussed below could be termed second element, component, region, layer or section without departing from the teachings of the present invention.

In one embodiment, a ZnO-based thin film transistor (TFT) is provided as illustrated in the cross-sectional view of FIG. 1. Referring to FIG. 1, a gate 20 is formed on a substrate 10, and a gate insulating layer 21 covering the gate 20 is also formed on the substrate 10. A channel layer 22 is formed on the gate insulating layer 21 in a position corresponding to the gate 20.

The material used for the substrate 10 is not particularly limited so long as it is one commonly used in the art. The substrate 10 may be formed of a transparent or opaque material such as silicon, glass, plastic, or other suitable material.

The channel layer 22 may be a ZnO-based semiconductor layer, for example, a gallium-indium-zinc-oxide (GIZO) layer. Specifically, the GIZO layer may be comprised of the layer $a(In_2O_3) \cdot b(Ga_2O_3) \cdot c(ZnO)$ wherein a, b, and c are predetermined constants. More specifically, the GIZO layer may be comprised of the layer $a(In_2O_3) \cdot b(Ga_2O_3) \cdot c(ZnO)$ wherein $a \geq 0$, $b \geq 0$, and $c > 0$. Even more specifically, the GIZO layer may be comprised of the layer $a(In_2O_3) \cdot b(Ga_2O_3) \cdot c(ZnO)$ wherein $a \geq 1$, $b \geq 1$, and $0 < c \leq 1$. The GIZO channel layer 22 may be formed using physical vapor deposition (PVD) methods comprising sputtering and evaporation.

A source electrode 23a and a drain electrode 23b are formed on both sides of the channel layer 22 and extend to portions of the substrate 10 not covered by the channel layer 22. Each of the source electrode 23a and the drain electrode 23b may be a metal layer. The metal layer may be selected from the group consisting of a molybdenum (Mo) single metal layer, a multi-metal layer comprising a Mo layer, a metal layer comprising titanium (Ti), and a metal layer comprising chromium (Cr), and a combination comprising at least one of the foregoing metal layers.

A thick passivation layer 24 is formed on the channel layer 22, the source electrode 23a, and the drain electrode 23b. The passivation layer 24 may be formed by plasma enhanced chemical vapor deposition (PECVD).

The channel layer 22, the source electrode 23a, the drain electrode 23b, the gate insulating layer 21, and the gate 20 may have thicknesses of about 30 to about 200 nanometers (nm), about 10 to about 200 nm, about 10 to about 200 nm, about 100 to about 300 nm, and about 100 to about 300 nm, respectively.

Although not shown, an ohmic contact layer may be interposed between the channel layer 22 and the source electrode 23a and between the channel layer 22 and the drain electrode 23b. The ohmic contact layer may be a conductive oxide layer having an oxygen content less than that of the channel layer 22. The ohmic contact layer reduces the contact resistance between the channel layer 22 and the source electrode 23a and between the channel layer 22 and the drain electrode 23b, and prevents holes from escaping from the channel layer 22.

The GIZO channel layer 22 of the ZnO-based TFT of FIG. 1 comprises chlorine (Cl). That is, the GIZO channel layer 22 comprises (Ga—In—Zn)—O and (Ga, In, Zn)—Cl ("GIZCl"). Specifically, the GIZCl may be distributed through the entire channel layer 22, and more specifically, may be distributed in a region near the surface of the channel layer 22.

The GIZCl may be distributed in the channel layer when the channel layer 22 is formed, or may be formed while the channel layer 22 is patterned. That is, the channel layer 22 comprising the GIZO and the GIZCl may be obtained by sputtering and evaporating $GaCl_3$, $InCl_3$, or $ZnCl_2$ together with the $Ga_2O_3$, $In_2O_3$, or ZnO. In this case, the channel layer 22 has GIZO as a main material and a small amount of GIZCl as a sub material. The ZnO-based channel layer 22 may be deposited by radio frequency ("RF") sputtering. In this case, the RF power may be about 100 to about 500 Watts (W), and the gas introduced into the chamber during the sputtering may be argon (Ar) and diatomic oxygen ($O_2$). When the flow rate of Ar is about 100 standard cubic centimeters per minute (sccm), the flow rate of $O_2$ may range from about 0 to about 100 sccm.

The GIZCl may be formed while the channel layer 22 is patterned, using plasma etching, to form the source electrode 23a and the drain electrode 23b. The channel layer 22 is patterned between the source electrode 23a and the drain electrode 23b by dry etching using a Cl-based etching gas. In this case, when the GIZO in a region of the channel layer 22 is exposed to plasma, the GIZO is damaged. As a result, an oxygen vacancy occurs in a grating structure, and the Cl gas subsequently fills the empty space of the grating structure. Consequently, due to the use of the Cl-based etching gas, the GIZO of the channel layer 22 is partially converted into GIZCl in the region of the channel layer 22 that has been damaged by the plasma, i.e. near the surface of the channel layer 22. When the type of plasma etching used to form the source electrode 23a and the drain electrode 23b is reactive ion etching (RIE), the power may be about 100 to about 1000 W, the process pressure using a gas mixture of $Cl_2$ or a Cl-based gas and oxygen as a reactive gas, may be about 10 to about 100 mTorr, and the flow rate of the oxygen may be more than about 10 sccm. In the ZnO-based TFT of FIG. 1, the GIZCl has a higher bonding energy than the GIZO, and thus the GIZCl is more stable than the GIZO against the plasma etching.

While the ZnO-based channel layer 22 is patterned into the source electrode 23a and the drain electrode 23b, chlorides are formed. As shown in Table 1, the chlorides, that is, $GaCl_3$, $InCl_3$, and $ZnCl_2$, have a higher bonding energy than $Ga_2O_3$, $In_2O_3$, and ZnO.

TABLE 1

| Element | Bonding Energy (kJ/mol at room temperature) | | Comparison |
| --- | --- | --- | --- |
| | Oxide | Chloride | |
| Ga | 354 | 481 | oxide < chloride |
| In | 320 | 439 | oxide < chloride |
| Zn | 159 | 229 | oxide < chloride |

The $GaCl_3$, $InCl_3$, and $ZnCl_2$ ($GaCl_x$, $InCl_x$, and $ZnCl_y$ respectively) have a high bonding energy, wherein $0<x\leq3$ and $0<y\leq2$. As such, when $GaCl_3$, $InCl_3$, and $ZnCl_2$ are present in the channel layer 22 they are minimally damaged by the plasma, which means that an oxygen vacancy resulting from damage due to the plasma can be prevented. Accordingly, when a silicon nitride ("SiNx") passivation layer 24 is formed by PECVD following the patterning of the channel layer 22, the channel layer 22 exposed to plasma is protected. Further, an increase in the carrier concentration can also be prevented.

Referring to Table 1, ZnO has the lowest bonding energy. The ZnO is first decomposed into Zn by the plasma, resulting in an increase in the carrier concentration due to the Zn, and the formation of a bond between the Zn and Cl. Accordingly, in order to prevent the increase in the carrier concentration due to the low bond energy of ZnO, the ZnO-based TFT of FIG. 1 allows for a larger amount of ZnCl to be distributed near the surface of the channel layer 22 in order to reduce the concentration of ZnO.

Figure 2:
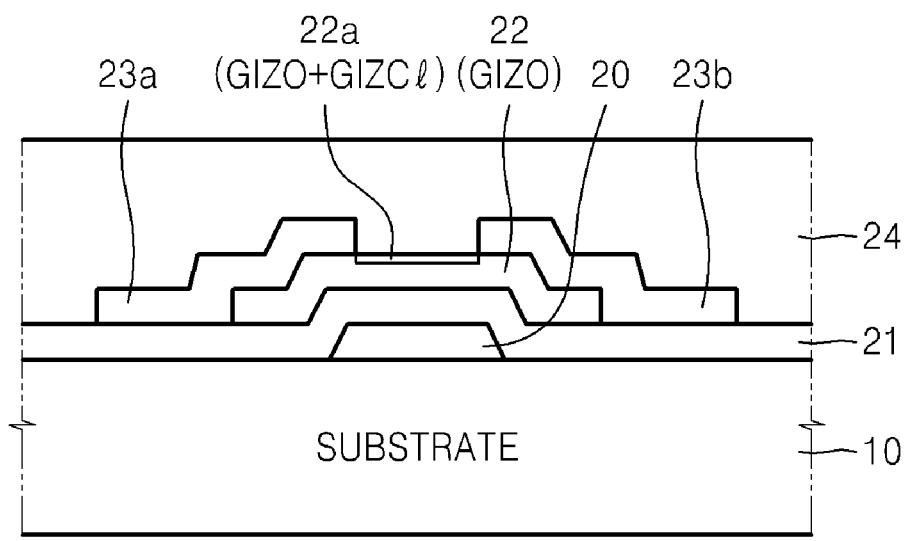
FIG. 2 is another exemplary cross-sectional view of a ZnO-based TFT.
Figure 3:
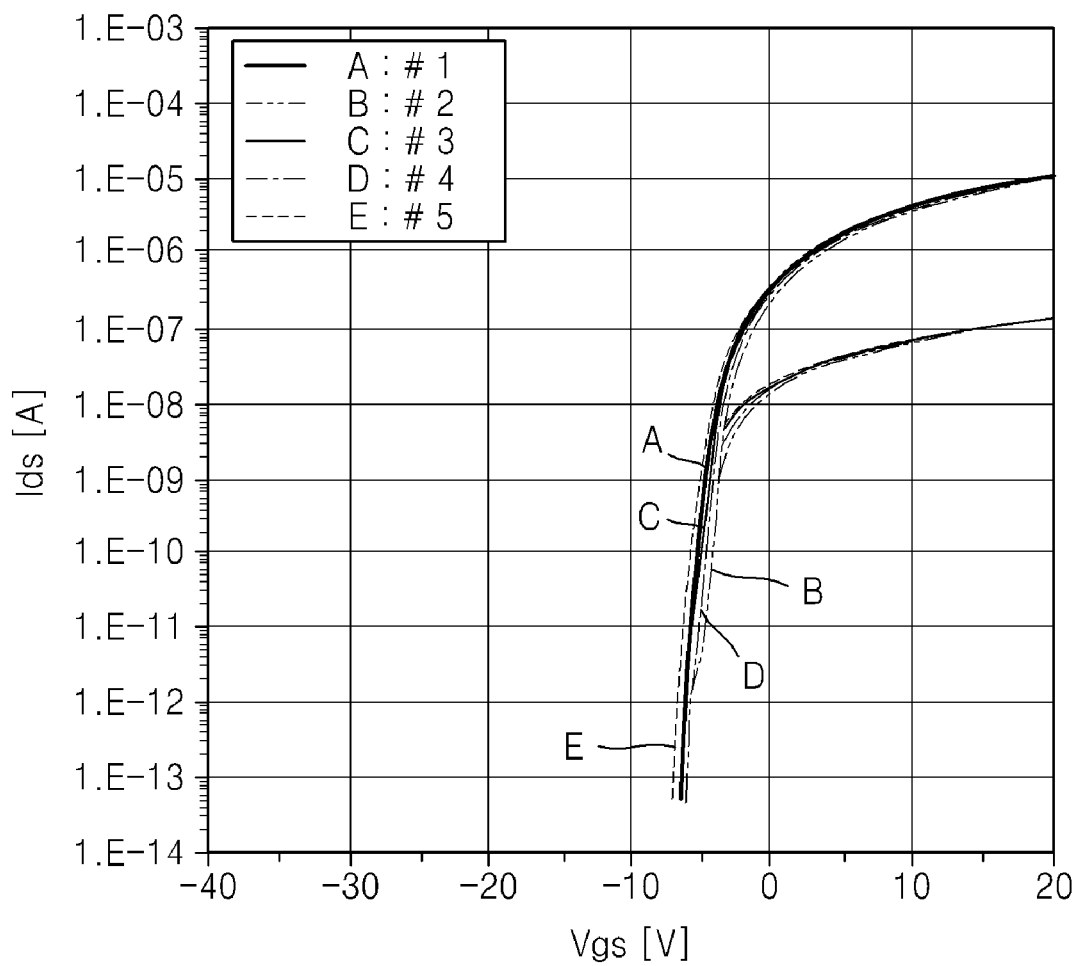
FIG. 3 is a graph illustrating the relationship between a source/drain current and a gate voltage for TFT samples.

In another embodiment, a ZnO-based TFT is provided as illustrated in the cross-sectional view of FIG. 2. FIG. 2 illustrates a Cl-rich region 22a, which comprises GIZO and GIZCl near the surface of the channel layer 22. Each of the TFTs illustrated in FIGS. 1 and 2, is a bottom gate back channel etching ("BCE") TFT in which the gate 20 is formed below the channel layer 22, and the chlorides are formed near the surface of the channel layer 22 or distributed in the entire channel layer 22 to prevent the channel layer 22 from being damaged by the plasma. FIG. 3 is a graph illustrating the electrical properties of the exemplary BCE ZnO-based TFT samples #1 through #5. The TFT samples were formed in an array on one substrate, such as a glass substrate and were randomly selected within 2 inches of one another. As shown in FIG. 3, the threshold voltage for each sample was approximately −7 V which is reasonable value, and the source-drain current was relatively linear at voltages greater than −7 V. A method for manufacturing a ZnO-based TFT according to embodiments of the present invention will now be explained.

In one embodiment, a method of manufacturing a TFT is provided as illustrated in the cross-sectional views of FIGS. 4A through 4F. The reference numerals in FIGS. 4A through 4F denote the same elements as described for FIG. 2.

Figure 4A:
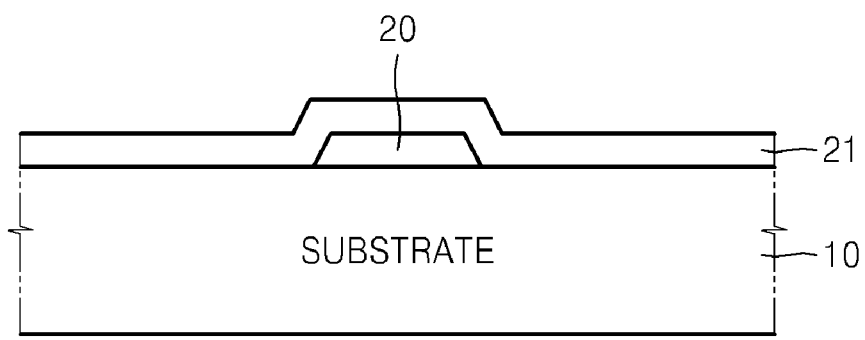
FIGS. 4A through 4F are exemplary illustrations detailing a method of manufacturing a TFT.

Referring to FIG. 4A, a gate 20 is formed on a substrate 10, and a $SiO_2$ or SiNx gate insulating layer 21 covering the gate 20 is formed on the substrate 10. Next, wet cleaning may be performed to remove any impurities existing on the top surface of the gate insulating layer 21. A cleaning solution used for the wet cleaning may be selected from isopropyl alcohol (IPA), deionized water, or acetone.

Figure 4B:
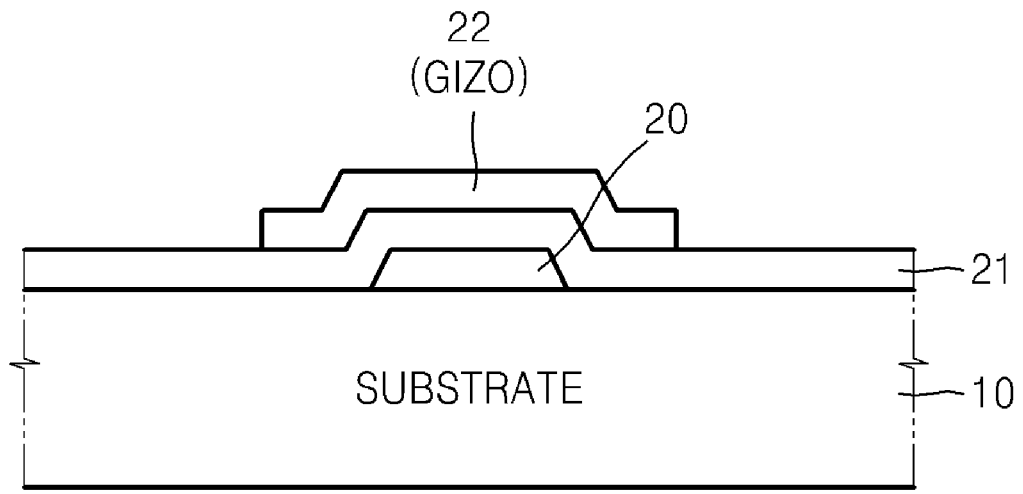

Referring to FIG. 4B, a channel layer 22 is formed on the gate insulating layer 21 in a position and of a shape corresponding to the gate, such that the channel layer 22 is disposed on the gate insulating layer 21 and over the gate 20. The channel layer 22 may be formed by PVD methods including sputtering and evaporation. The channel layer 22 may be formed by sputtering at least one oxide selected from In$_2$O$_3$, Ga$_2$O$_3$, and ZnO. Accordingly, the channel layer 22 has GIZO as a main material.

Figure 4C:
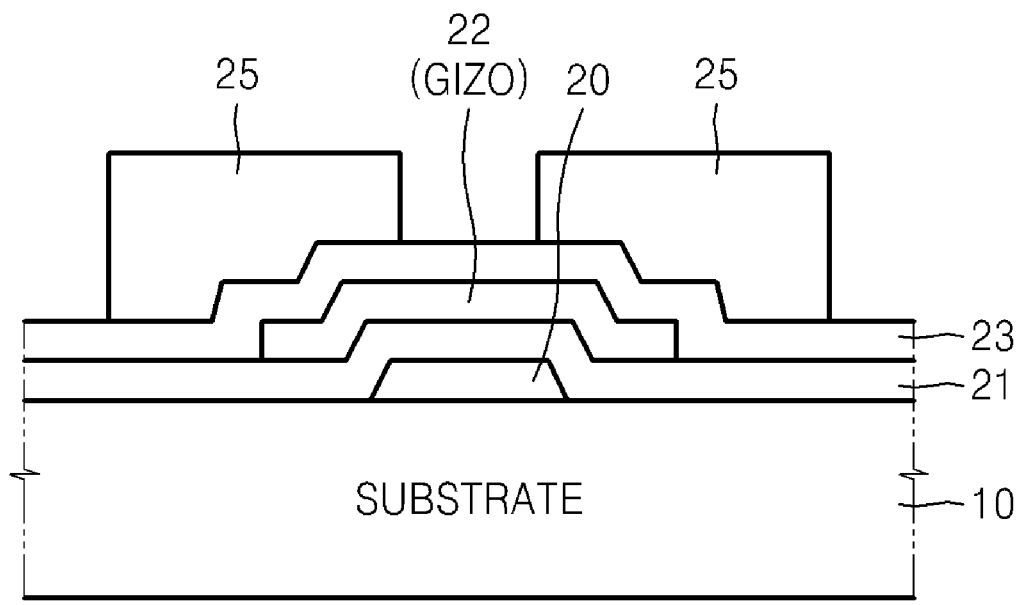

Referring to FIG. 4C, a metal layer 23 covering the channel layer 22 is formed on the gate insulating layer 21, and a photoresist mask 25 for forming a source electrode 23a and a drain electrode 23b is then formed on the metal layer 23. The metal layer 23 may be selected from a Mo single metal layer, a multi-metal layer comprising a Mo layer, a metal layer comprising Ti, a metal layer comprising Cr, or a combination comprising at least one of the foregoing metal layers. Alternatively, metal layers comprising Pt, Cu, Al, W, MoW, AlNd, Ni, Ag, Au, indium zinc oxide ("IZO"), indium tin oxide ("ITO"), or a silicide thereof, or a combination comprising at least one of the foregoing metals may be used. The metal layer 23 formed of the material may be formed by PVD.

If the metal layer 23 used for the formation of the source electrode 23a and the drain electrode 23b is formed at high temperature, an ohmic contact layer (not shown) having an oxygen content less than that of the channel layer 22, may be formed between the channel layer 22 and the source electrode 23a and between the channel layer 22 and the drain electrode 23b. The ohmic contact layer may be formed during the formation of the source electrode 23a and the drain electrode 23b. If the ohmic contact layer is not formed during the formation of the source electrode 23a and the drain electrode 23b, annealing of the electrodes may be performed after the source electrode 23a and the drain electrode 23b have been formed. An interaction between the source electrode 23a and the drain electrode 23b occurs as a result of the annealing, thereby forming the ohmic contact layer.

Figure 4D:
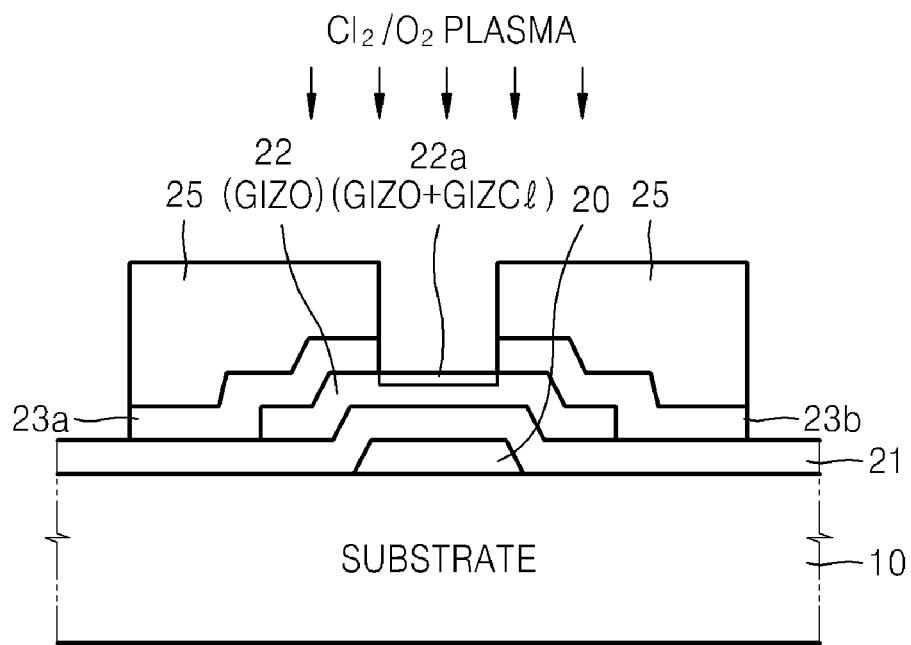

Referring to FIG. 4D, an exposed portion of the metal layer 23 that is not covered by the mask 25, is removed by plasma etching using a chlorine gas (Cl$_2$) or a chlorine-based gas resulting in the formation of the source electrode 23a and the drain electrode 23b which contact both sides of the channel layer 22 on the gate insulating layer 21. At least one additional gas is mixed in the chlorine gas or the chlorine based gas. Example of gases that may be used in the gas mixture include oxygen, nitrogen, sulfur hexafluoride (SF6), fluorine (F)-based gas, iodine (I)-based gas, bromine (Br)-based gas, argon (Ar), xenon (Xe), or krypton (Kr), or a combination comprising at least one of the foregoing gases. Specifically, a mixture of a chlorine-based gas or a fluorine-based gas and oxygen may be used. The partial pressure ratio of the chlorine-based gas and the oxygen, or the partial pressure ratio of the chlorine-based gas and the fluorine-based gas, may range from about 0.001 to about 0.99. When the gate insulating layer 21 is formed of SiNx, it is preferable that SF6 be omitted from the gas mixture because SF6 has the ability to etch the SiNx as well as the metal of the metal layer, and thus the gate insulating layer 21 may be etched by the SF6 while the metal layer 23 is patterned to form the source and drain electrodes 23a and 23b.

During the formation of the source electrode 23a and the drain electrode 23b by plasma etching, a region 22a where GIZO is converted into GIZCl, is formed near a surface of the channel layer 22 exposed to the plasma.

Figure 4E:
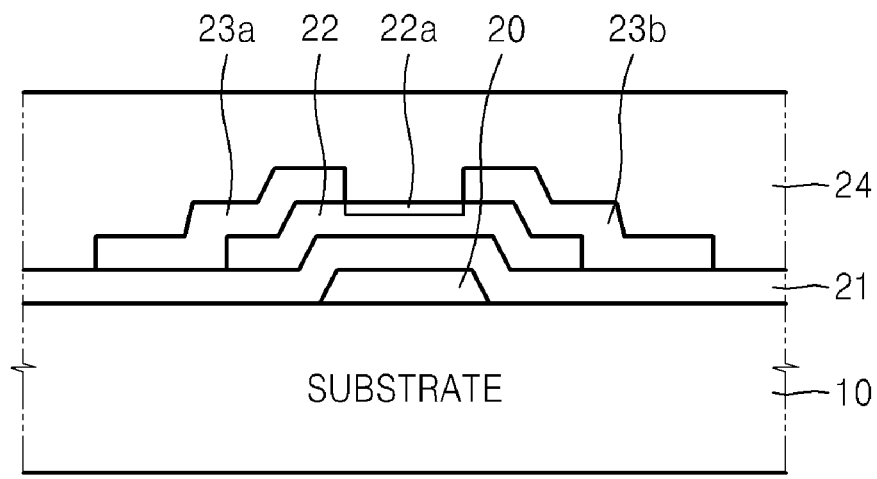

Referring to FIG. 4E, a passivation layer 24 covering the source electrode 23a and the drain electrode 23b is formed by PECVD on the gate insulating layer 21.

Figure 4F:
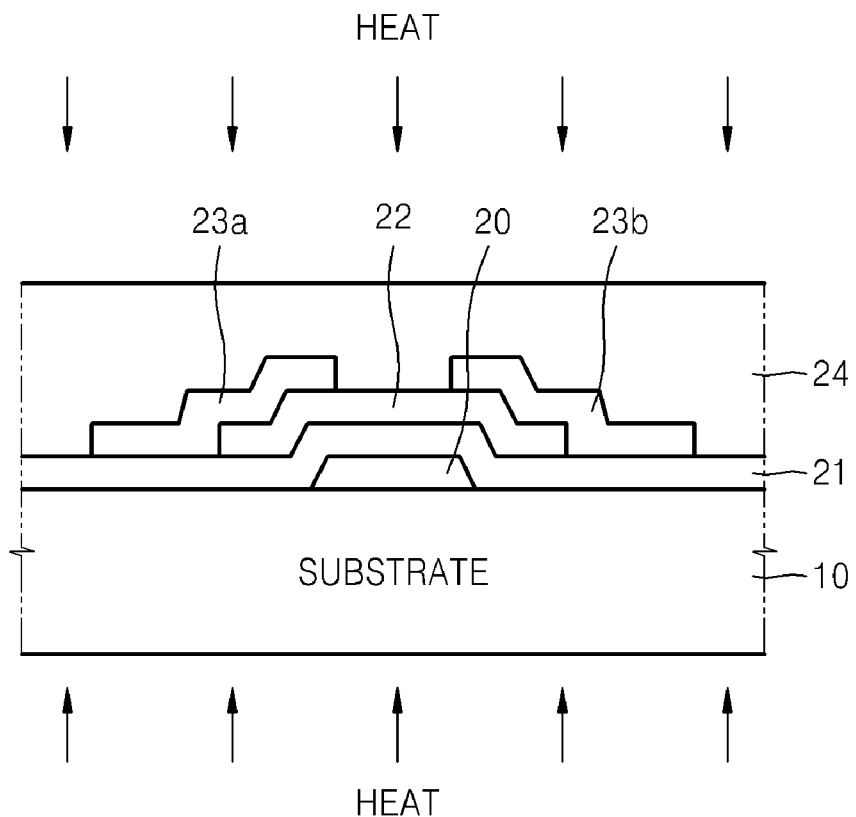

Referring to FIG. 4F, the channel layer 22 and the passivation layer 24 are subjected to annealing. The annealing may be furnace annealing or rapid thermal annealing ("RTA"), and may be performed for about 10 minutes to about 2 hours at a temperature of about 200 to about 400° C. in an oxygen or nitrogen atmosphere. Specifically, the annealing may be performed for about 1 hour at a temperature of about 200° C. As a result of the annealing, the carrier concentration in the channel layer 22 is reduced, thereby obtaining a TFT having the desired electrical properties and the desired threshold voltage.

In another embodiment, a method of manufacturing a TFT is provided as illustrated by the cross-sectional views of FIGS. 5A through 5E. The reference numerals denoted in FIG. 1 are applicable to FIGS. 5A through 5E and thus denote the same elements.

Figure 5A:
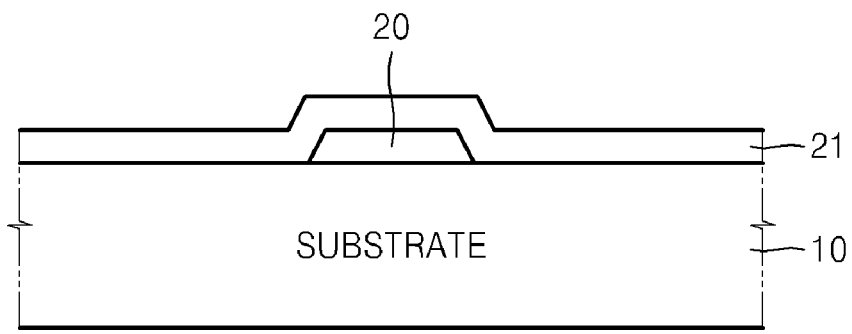
FIGS. 5A through 5F are exemplary illustrations detailing another method of manufacturing a TFT.

Referring to FIG. 5A, a gate 20 is formed on a substrate 10, and a SiO$_2$ or SiNx gate insulating layer 21 covering the gate 20 is formed on the substrate 10. Next, wet cleaning may be performed to remove any impurities existing on a top surface of the gate insulating layer 21.

Figure 5B:
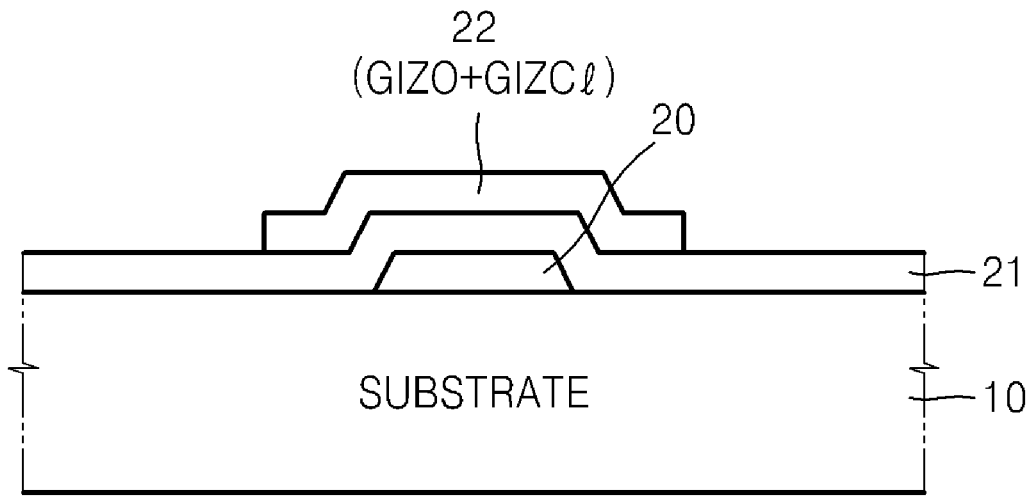

Referring to FIG. 5B, a channel layer 22 is formed on the gate insulating layer 21 in a position corresponding to the gate, such that the channel layer 22 is disposed on the gate insulating layer 21 and over the gate 20. The channel layer 22 may be formed by PVD methods including sputtering and evaporation. The channel layer 22 may be formed by sputtering at least one oxide selected from In$_2$O$_3$, Ga$_2$O$_3$, or ZnO, together with at least one chloride of GaCl$_3$, InCl$_3$, or ZnCl$_2$. Accordingly, the channel layer 22 comprises GIZO as the primary material, and a small amount of GIZCl as a sub material.

Figure 5C:
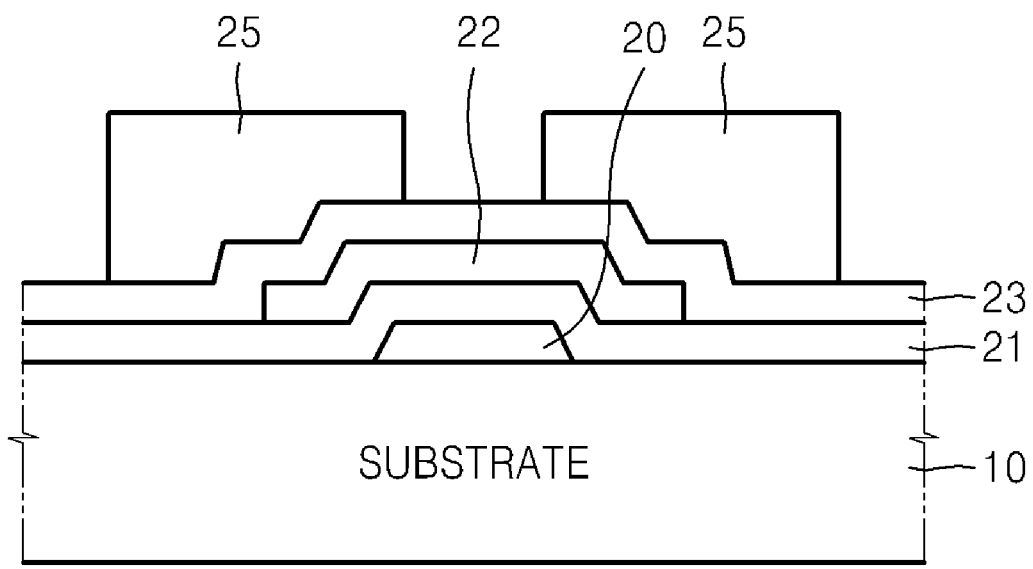

Referring to FIG. 5C, a metal layer 23 covering the channel layer 22 is formed on the gate insulating layer 21, and a photoresist mask 25 for forming a source electrode 23a and a drain electrode 23b is formed on the metal layer 23. The metal layer 23 may be selected from a Mo single metal layer, a multi-metal layer comprising a Mo layer, a metal layer comprising Ti, a metal layer comprising Cr, or a combination comprising at least one of the foregoing metal layers. Alternatively, metal layers comprising Pt, Cu, Al, W, MoW, AlNd, Ni, Ag, Au, IZO, ITO, or a silicide thereof, or a combination comprising at least one of the foregoing metals may be used. The metal layer 23 may be formed by PVD.

If the metal layer 23 used for the formation of the source electrode 23a and the drain electrode 23b is formed at high temperature, an ohmic contact layer (not shown) having an oxygen content less than that of the channel layer 22, may be formed between the channel layer 22 and the source electrode 23a, and between the channel layer 22 and the drain electrode 23b. The ohmic contact layer may be formed during the formation of the source electrode 23a and the drain electrode 23b. However, if the ohmic contact layer is not formed during the formation of the source electrode 23a and the drain electrode 23b, annealing may be performed after the source electrode 23a and the drain electrode 23b are formed. An interaction between the channel layer 22 and the source electrode 23a and between the channel layer 22 and the drain layer 23b occurs as a result of the annealing, thereby forming the ohmic contact layer.

Figure 5D:
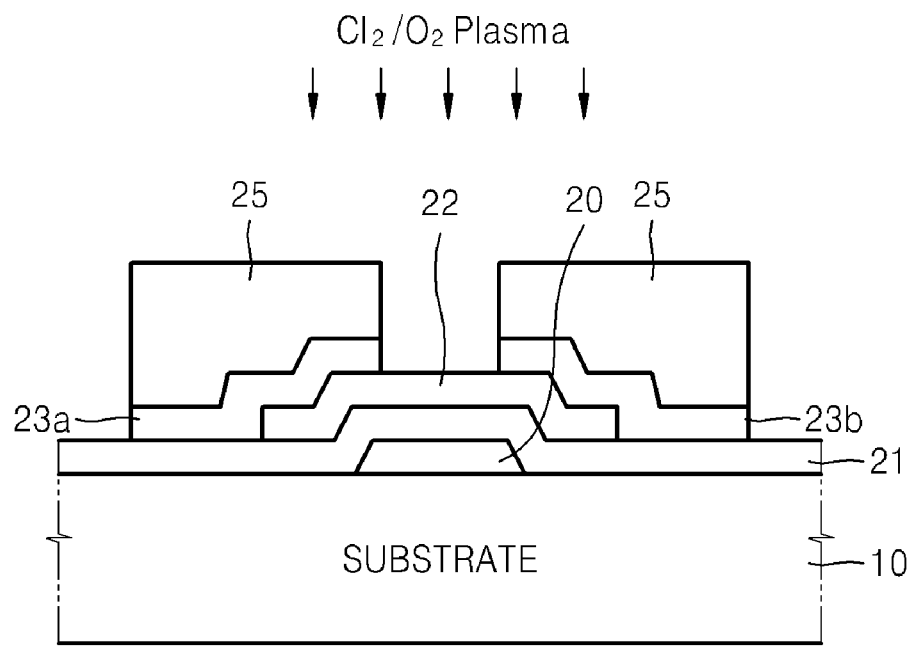

Referring to FIG. 5D, an exposed portion of the metal layer 23 that is not covered by the mask 25, is removed by plasma etching using a general etching gas, specifically, a chlorine gas or a chlorine-based gas, resulting in the formation of the source electrode 23a and the drain electrode 23b in contact with both sides of the channel layer 22 on the gate insulating layer 21. At least one additional gas is mixed in the chlorine gas or the chlorine based gas. Examples of gases that may be used in the gas mixture include those selected from the group consisting of oxygen, nitrogen, SF6, F-based gas, I-based gas, Br-based gas, Ar, Xe, Kr, and combinations comprising at least one of the foregoing gases. Specifically, a gas mixture of a chlorine-based gas or a fluorine-based gas and oxygen may be used herein. The partial pressure ratio of the chlorine-based gas to the oxygen, or the partial pressure ratio of the chlorine-based gas to the fluorine-based gas, may be in an amount of about 0.001 to about 0.99. When the gate insulating layer 21 is formed of SiNx, SF6 may be omitted for the reason described above.

When the source electrode 23a and the drain electrode 23b are formed by plasma etching, the gate insulating layer 21 exposed to the plasma is protected.

Figure 5E:
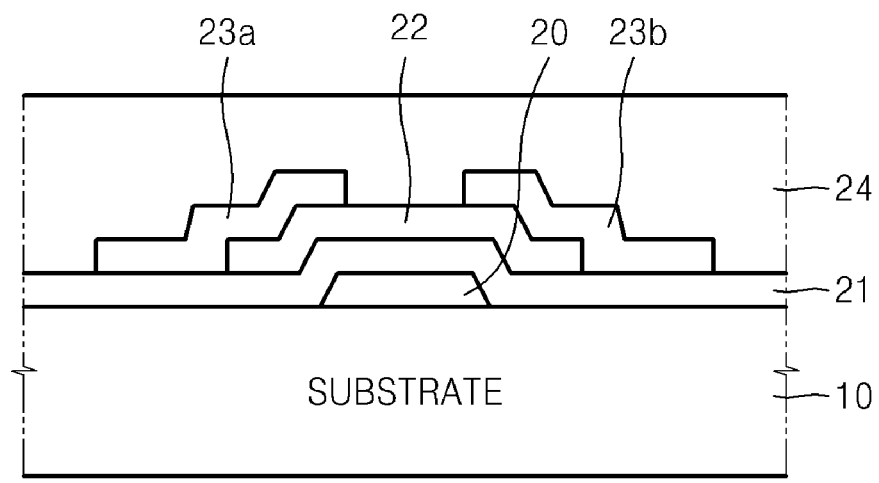

Referring to FIG. 5E, a passivation layer 24 covering the channel layer 22, the source electrode 23a, and the drain electrode 23b, is formed by PECVD on the gate insulating layer 21.

Figure 5F:
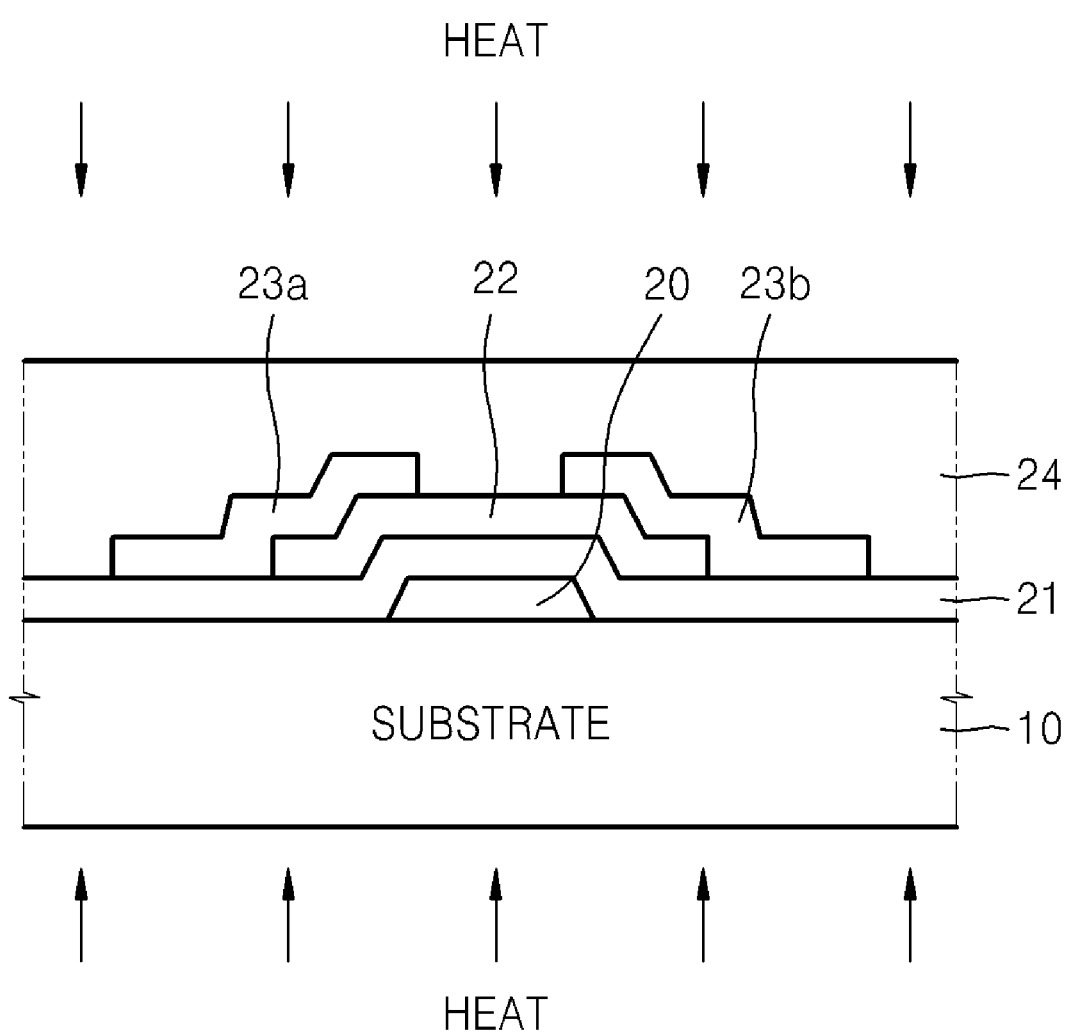

Referring to FIG. 5F, the channel layer 22 and the passivation layer 24 are subjected to annealing. The annealing may comprise furnace annealing or RTA, and may be performed for about 10 minutes to about 2 hours at a temperature of about 200 to about 400° C. in an oxygen or a nitrogen atmosphere. Specifically, the annealing may be performed for about 1 hour at a temperature of about 200° C. As a result of the annealing, the carrier concentration in the channel layer 22 is reduced, thereby resulting in a TFT having the desired electrical properties and the desired threshold voltage.

Accordingly, the formation of chlorides in the channel layer prevents an increase in the carrier concentration as the result of the damage, which may be caused by plasma etching. As a result, a TFT can have the desired properties.

As described above, a ZnO-based TFT, particularly, a GIZO TFT, can have a desired threshold voltage by controlling the carrier concentration. The TFT described herein can be applied to both a LCDs and OLEDs which require a large switching element. That is, the TFT can be an oxide semiconductor TFT to substituting for a conventional a-Si TFT, or a poly-Si TFT, and the TFT can be applied to a flat panel display, specifically, to an LCD and an OLED, which require a TFT-based switching and driving element. The TFT according to the present invention can also be applied to a cellular phone, a mobile device, a notebook computer, a monitor, or a TV that employ an LCD or an OLED.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor comprising:
   a substrate;
   a channel layer comprising ZnO disposed on the substrate;
   a gate disposed between the substrate and the channel layer;
   a gate insulating layer disposed between the channel layer and the gate;
   a source electrode and a drain electrode disposed on both sides of the channel layer; and
   a passivation layer covering the channel layer, the source electrode, and the drain electrode,
   wherein the channel layer comprises a chloride, and wherein the chloride is distributed in a region near an upper surface of the channel layer.

2. The thin film transistor of claim 1, wherein the gate insulating layer comprises SiNx.

3. The thin film transistor of claim 1, wherein the channel layer comprises gallium-indium-zinc-oxide.

4. The thin film transistor of claim 1, wherein the chloride is gallium-indium-zinc-chloride.

5. The thin film transistor of claim 1, wherein the chloride is selected from the group consisting of $GaCl_3$, $InCl_3$, $ZnCl_2$, and a combination comprising at least one of the foregoing chlorides.

6. The thin film transistor of claim 5, wherein the channel layer comprises gallium-indium-zinc-oxide.

* * * * *